US011030364B2

(12) United States Patent
Sholingar et al.

(10) Patent No.: US 11,030,364 B2
(45) Date of Patent: Jun. 8, 2021

(54) EVALUATING AUTONOMOUS VEHICLE ALGORITHMS

(71) Applicant: Ford Global Technologies, LLC, Dearborn, MI (US)

(72) Inventors: Gautham Sholingar, Sunnyvale, CA (US); Sravani Yajamanam Kidambi, Sunnyvale, CA (US); Vidya Nariyambut Murali, Sunnyvale, CA (US); Jinesh Jain, Palo Alto, CA (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 357 days.

(21) Appl. No.: 16/129,145

(22) Filed: Sep. 12, 2018

(65) Prior Publication Data
US 2020/0082034 A1 Mar. 12, 2020

(51) Int. Cl.
*G06F 30/20* (2020.01)
*G06N 20/00* (2019.01)

(52) U.S. Cl.
CPC .......... *G06F 30/20* (2020.01); *G06N 20/00* (2019.01)

(58) Field of Classification Search
CPC ..................................... G06F 30/20
USPC .................................... 703/8
See application file for complete search history.

(56) References Cited

U.S. PATENT DOCUMENTS

| 8,364,402 | B2* | 1/2013 | Ross | G01C 21/26 701/534 |
| 10,114,618 | B2* | 10/2018 | Wee | G06F 8/34 |
| 10,176,634 | B2* | 1/2019 | Micks | G09B 9/00 |
| 10,255,168 | B2* | 4/2019 | Stefan | G06F 11/3684 |
| 10,358,143 | B2* | 7/2019 | Jain | G06F 16/285 |
| 10,558,224 | B1* | 2/2020 | Lin | G08G 1/165 |
| 10,832,093 | B1* | 11/2020 | Taralova | G06K 9/6262 |
| 2007/0088469 | A1* | 4/2007 | Schmiedel | G05D 1/0274 701/23 |
| 2015/0331422 | A1* | 11/2015 | Hartung | H04L 12/40013 701/23 |
| 2017/0057521 | A1* | 3/2017 | Jain | G06F 16/285 |
| 2017/0132334 | A1* | 5/2017 | Levinson | G06F 30/20 |

(Continued)

FOREIGN PATENT DOCUMENTS

| CN | 105954040 A | 9/2016 |
| CN | 104570765 B | 5/2017 |

OTHER PUBLICATIONS

Hallerbach et al. ("Simulation-Based Identification of Critical Scenarios for Cooperative and Automated Vehicles", SAE International, 2018, pp. 94-106). (Year: 2018).*

(Continued)

*Primary Examiner* — Iftekhar A Khan
(74) *Attorney, Agent, or Firm* — David R. Stevens; Stevens Law Group

(57) ABSTRACT

The present invention extends to methods, systems, and computer program products for evaluating autonomous vehicle algorithms. Aspects use (e.g., supervised) machine learning techniques to analyze performance of autonomous vehicle algorithms on real world and simulated data. Machine learning techniques can be used to identify scenario features that are more likely to influence algorithm performance. Machine learning techniques can also be used to consolidate insights and automate the generation of relevant test cases over multiple iterations to identify error-prone scenarios.

20 Claims, 5 Drawing Sheets

(56) References Cited

U.S. PATENT DOCUMENTS

| | | | | |
|---|---|---|---|---|
| 2017/0139411 | A1* | 5/2017 | Hartung | G05D 1/0077 |
| 2018/0012092 | A1* | 1/2018 | Gleeson-May | G06K 9/00281 |
| 2018/0025640 | A1* | 1/2018 | Micks | G06K 9/00812 |
| | | | | 340/932.2 |
| 2018/0060725 | A1* | 3/2018 | Groh | G06N 3/08 |
| 2018/0074502 | A1* | 3/2018 | Holben | B60W 30/18154 |
| 2018/0093671 | A1* | 4/2018 | Allan | G05D 1/0223 |
| 2018/0107770 | A1* | 4/2018 | Cahoon | G09B 29/007 |
| 2019/0129436 | A1* | 5/2019 | Sun | G06N 7/005 |
| 2019/0130056 | A1* | 5/2019 | Tascione | G06F 30/20 |
| 2019/0145860 | A1* | 5/2019 | Phillips | G01M 17/007 |
| | | | | 701/33.9 |
| 2019/0310636 | A1* | 10/2019 | Halder | G05D 1/0221 |
| 2019/0310649 | A1* | 10/2019 | Halder | G06N 3/006 |
| 2019/0310654 | A1* | 10/2019 | Halder | G05D 1/0088 |
| 2019/0324458 | A1* | 10/2019 | Sadeghi | G05D 1/0088 |
| 2019/0369626 | A1* | 12/2019 | Lui | G05D 1/0219 |
| 2020/0026277 | A1* | 1/2020 | Palanisamy | G06N 7/005 |
| 2020/0031361 | A1* | 1/2020 | Soliman | B60W 50/16 |
| 2020/0051327 | A1* | 2/2020 | Dolan | G06N 3/04 |

OTHER PUBLICATIONS

Ahmed et al. ("Software-in-the-loop Modeling and Simulation Framework for Autonomous Vehicles", IEEE, 2018, pp. 1-7) (Year: 2018).*

Zhou et al. ("Road Detection Using Support Vector Machine based on Online Learning and Evaluation", IEEE, 2010, pp. 256-261). (Year: 2010).*

Gechteretal. (Towards a Hybrid Real/Virtual Simulation of Autonomous Vehicles for Critical, 2014, IARIA, pp. 14-17) (Year: 2014).*

* cited by examiner

EVALUATING AUTONOMOUS VEHICLE ALGORITHMS

CROSS-REFERENCE TO RELATED APPLICATIONS

Not applicable.

BACKGROUND

1. Field of the Invention

This invention relates generally to the field of autonomous vehicles, and, more particularly, to evaluating autonomous vehicle algorithms.

2. Related Art

Defining testing scenarios, for example, to train autonomous vehicles, is manual, labor-intensive, and limited by an engineer's ability to design challenging scenarios. The manual process can obscure failure modes for algorithm performance as the number of parameters and number of possible parameter values scales up. Additionally, algorithms can be tested across numerous interactions generating large quantities of test results data. Manually parsing test result data is also a manual, labor-intensive activity.

BRIEF DESCRIPTION OF THE DRAWINGS

The specific features, aspects and advantages of the present invention will become better understood with regard to the following description and accompanying drawings where.

DETAILED DESCRIPTION

Figure 1:
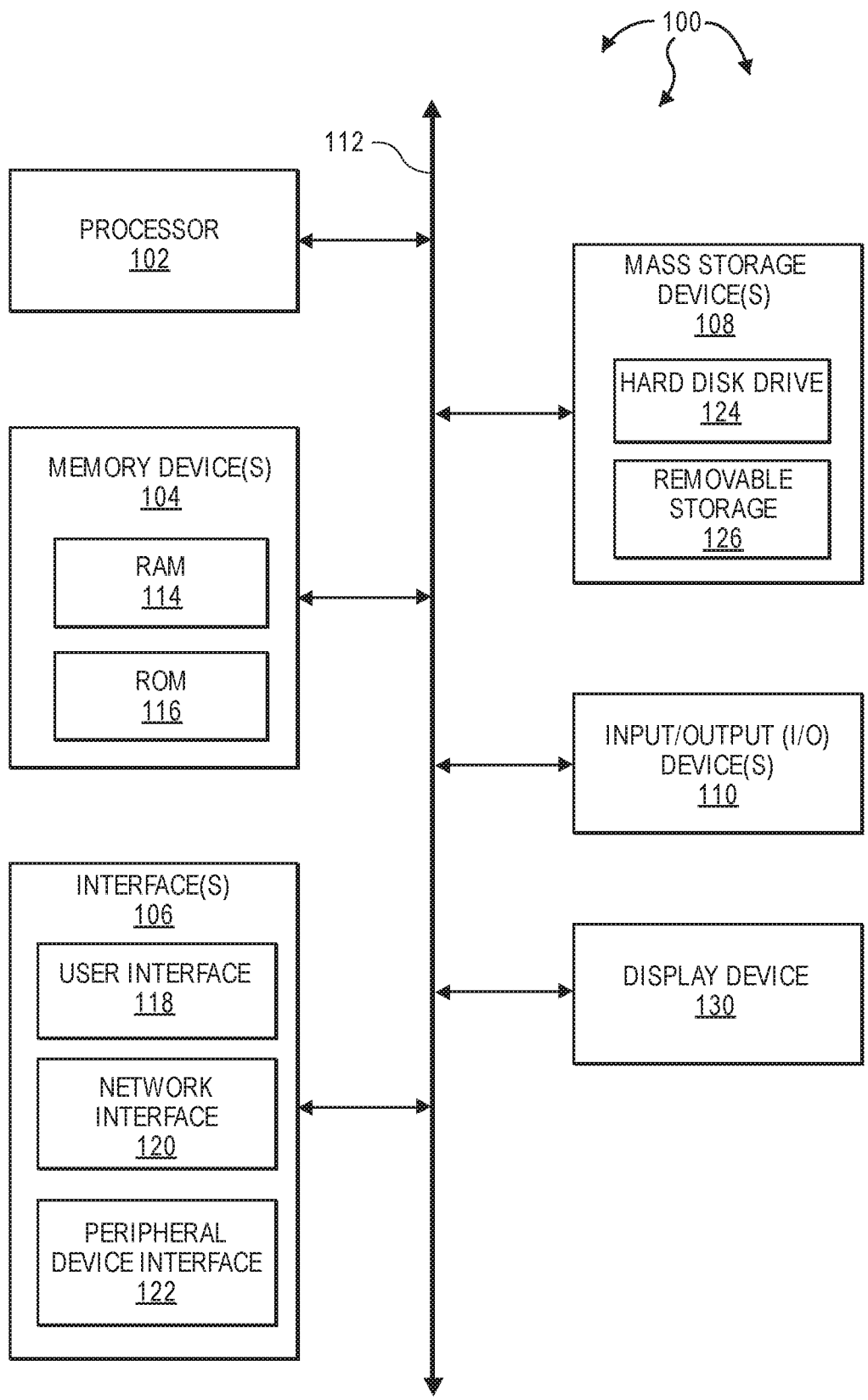
FIG. 1 illustrates an example block diagram of a computing device.

The present invention extends to methods, systems, and computer program products for evaluating autonomous vehicle algorithms.

One challenge in developing production level code for autonomous vehicles is validating performance over millions of miles of road testing. As such, automotive manufacturers use simulation tools, including gaming engines, to manually generate scenarios, collect simulated sensor data, and validate autonomous vehicle algorithm performance. In other aspects, automotive manufacturers use real world data as a component of autonomous vehicle algorithm validation. After initially testing an algorithm, an engineer derives a hypothesis about how different parameters affect algorithm performance. To confirm the hypothesis, the engineer executes additional rounds of testing to identify parameter trends in error-prone scenarios. As algorithms become more complex and scenarios scale (e.g., including 100s of parameters) blind spots become inevitable and lead to safety risks.

Design of Experiments (DOE) techniques are used by engineers to manually derive and consolidate insights about algorithm performance. DOE techniques are difficult to apply as the number of parameters scales up and scenarios become more complex. Thus, in general, testing autonomous vehicle algorithm hypotheses on simulated data is time-consuming, complex, and does not scale well.

As such, aspects of the invention use (e.g., supervised) machine learning techniques, such as, Support Vector Machines (SVMs), to analyze performance of autonomous vehicle algorithms on simulated data. Machine learning techniques can be used to identify scenario features that are more likely to influence algorithm performance. Machine learning techniques can also be used to consolidate insights and automate the generation of relevant test cases over multiple iterations to identify error-prone scenarios.

A database is loaded with (a potentially exhaustive) list of different feature combinations for a scenario. Feature combinations for a scenario can include vehicle poses, environmental factors, and other aspects of a simulation, such as, of a feature for L2-L5 automation. A selection of different feature value combinations is chosen. Sensor data and ground truth is generated for each different feature combination. Sensor data for each different feature combination is fed into a (e.g., autonomous vehicle) algorithm. For each different feature combination, the algorithm determines metrics for the scenario, such as, a binary metric (e.g.,) if a scenario passed (succeeded) or failed, a non-binary metric, or other custom defined metric. The algorithm outputs each feature value combination along with an indication of metrics, such as, if the algorithm passed or failed.

The algorithm output is fed to a machine learning classifier. In one aspect, the machine learning classifier is an SVM with a linear kernel. However, other supervised learning models and/or kernels can also be used. The machine learning classifier can transform the algorithm output to a higher-dimensional feature space report indicative of how often different feature values were associated with a failure. The high-dimensional feature space report can be used to find better separation between multiple classes.

The SVM with linear kernel can also obtain a vector of weights, where each weight is associated with a specific feature. The magnitude of weights can be used to identify the importance of different features on algorithm success. For example, weights can be used to identify the importance of weather, ground surface, lighting conditions, etc., on the success of an autonomous vehicle algorithm or feature. An autonomous feature can include any feature for L2-L5 automation, for example, automated lane change, other highway driving features (up to full autonomy), etc. The machine learning classifier can generate a feature importance report using the weights.

The higher-dimensional feature space report can be used to obtain a feature importance report (e.g., vector of weights). A summary of the higher-dimensional feature space report and/or the feature report can be presented on a visualization dashboard to indicate features and how the features contributed to algorithm success/failure. The visualization dashboard can provide an engineer with insight to make further testing decisions.

In one aspect, the engineer stops the testing process and modifies the algorithm to improve performance. In another aspect, the engineer runs another testing iteration. The engineer can select more important feature values based on the higher-dimensional feature space report and feature importance report. For example, the engineer may select the three features with the highest magnitude of weights. The engineer can use the three features to automate the DOE process. For example, the analysis can identify ground types that lead to reduced chances of collision between an ego vehicle and other simulation actors when testing a collision avoidance algorithm. The trends can be used to design queries for the next iteration.

Accordingly, the iterative approach significantly reduces the amount of manual work for an engineer to analyze algorithm performance. Automatic identification of features and feature values having more impact on simulation and real world results reduces the computation effort and time to run batch testing. After each iteration, the engineer can gain insight from the higher-dimensional feature space report and feature importance report (e.g., vector of weights) to better prioritize algorithm improvement efforts.

Further, productivity is improved for (e.g., large scale) algorithm testing. By automating the process of scenario querying and selection for subsequent iterations, tests can focus more coverage on scenarios that lead to algorithm failure instead of a randomized selection.

FIG. 1 illustrates an example block diagram of a computing device 100. Computing device 100 can be used to perform various procedures, such as those discussed herein. Computing device 100 can function as a server, a client, or any other computing entity. Computing device 100 can perform various communication and data transfer functions as described herein and can execute one or more application programs, such as the application programs described herein. Computing device 100 can be any of a wide variety of computing devices, such as a mobile telephone or other mobile device, a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer storage media, such as cache memory.

Memory device(s) 104 include various computer storage media, such as volatile memory (e.g., random access memory (RAM) 114) and/or nonvolatile memory (e.g., read-only memory (ROM) 116). Memory device(s) 104 may also include rewritable ROM, such as Flash memory.

Mass storage device(s) 108 include various computer storage media, such as magnetic tapes, magnetic disks, optical disks, solid state memory (e.g., Flash memory), and so forth. As depicted in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, barcode scanners, microphones, monitors or other display devices, speakers, printers, network interface cards, modems, cameras, lenses, radars, CCDs or other image capture devices, and the like.

Display device 130 includes any type of device capable of displaying information to one or more users of computing device 100. Examples of display device 130 include a monitor, display terminal, video projection device, and the like.

Interface(s) 106 include various interfaces that allow computing device 100 to interact with other systems, devices, or computing environments as well as humans.

Example interface(s) 106 can include any number of different network interfaces 120, such as interfaces to personal area networks (PANs), local area networks (LANs), wide area networks (WANs), wireless networks (e.g., near field communication (NFC), Bluetooth, Wi-Fi, etc., networks), and the Internet. Other interfaces include user interface 118 and peripheral device interface 122.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

In this description and the following claims, an autonomous vehicle can be a land-based vehicle, for example, a car, a van, a truck, etc.

Figure 2:
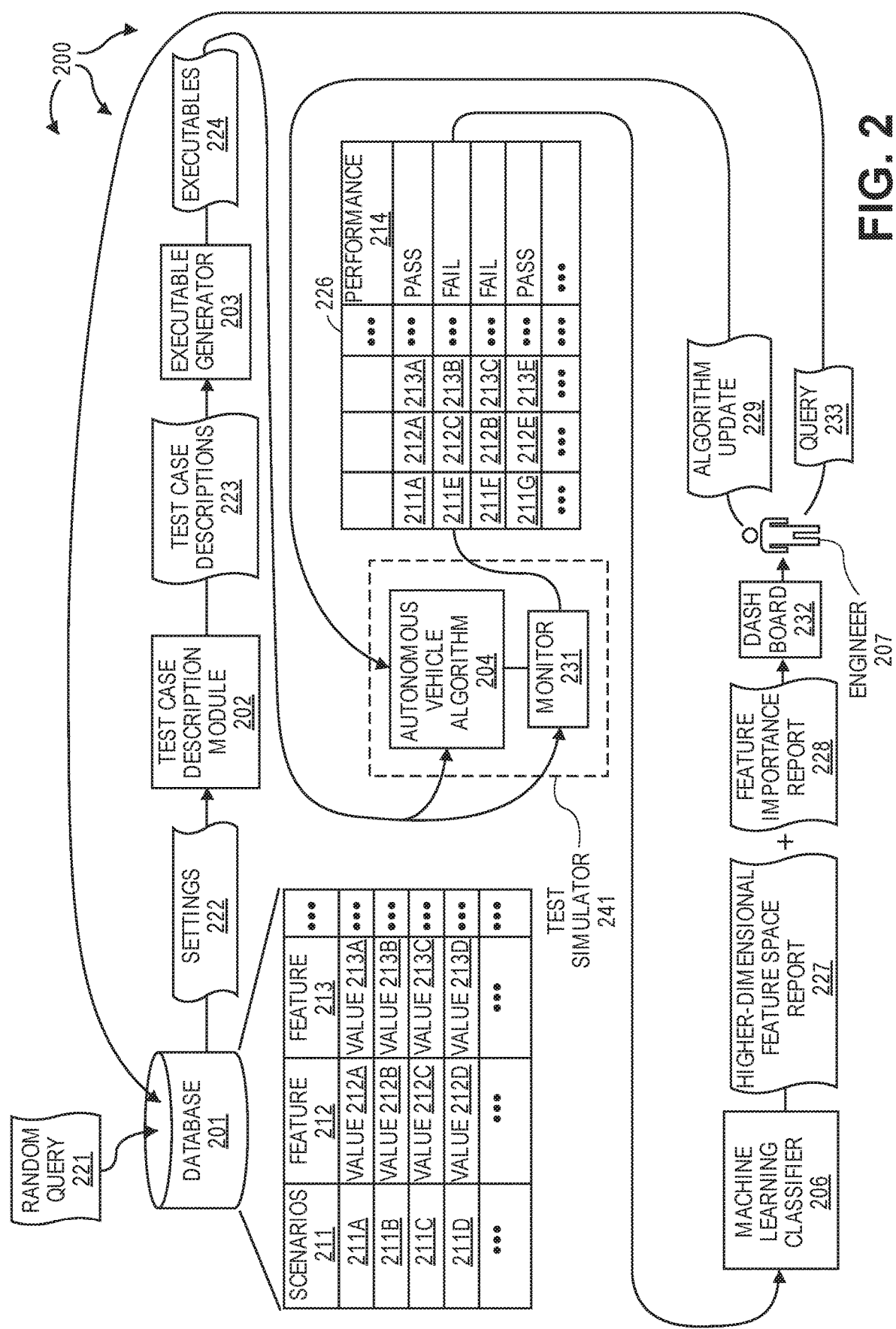
FIG. 2 illustrates an example computer architecture that facilitates evaluating an autonomous vehicle algorithm.

FIG. 2 illustrates an example computer architecture 200 for evaluating autonomous vehicle algorithms. As depicted, computer architecture 200 includes database 201, test case description module 202, executable generator 203, test simulator 241, machine learning classifier 206, dashboard 232, and engineer 207. Test simulator 241 further includes autonomous vehicle algorithm 204 and monitor 231.

Database 201 can include an extensive (and possibly an exhaustive) set of scenarios 211 (e.g., 211A, 211B, 211C, 211D, etc.) for testing autonomous vehicle algorithm 204. Each scenario defines a different set of conditions under which performance of autonomous vehicle algorithm 204 is to be tested. Each scenario can also define scripted dynamic motion of different actors in a scene and their characteristics.

The conditions are set by selecting different combinations of values for features 212, 213, etc. For example, scenario 211A includes values 212A, 213A, etc. for features 212, 213, etc. respectively. Scenario 211B includes values 212B, 213B, etc. for features 212, 213, etc. respectively. Scenario 211C includes values 212C, 213C, etc. for features 212, 213, etc. respectively. Scenario 211D includes values 212D, 213D, etc. for features 212, 213, etc. respectively. Values can include static values for environment features as well as scripts for dynamic motion. Thus, database 201 can store a combination of static values and scripted dynamic motions.

Each feature represents a variable, for example, weather, ground surface, lighting conditions, sun angle, etc. that can have any variety of different values. For example, weather values can include rain, snow, hail, sun, etc. Ground surface values can include grass, concrete, asphalt, gravel, basic, etc. Each feature can be associated with two or more values and up to a dozen or more values. In one aspect, database 201 includes a scenario for every possible different combination of feature values. As such, database 201 can potentially define millions of different scenarios for testing autonomous vehicle algorithm 204.

Test case description module 202 is configured to convert environments defined in database 201 into test case descriptions. In one aspect, test case description module 202 creates a scenario description file (e.g., a "YAML Ain't Markup Language" (YAML) file, a JSON file, a txt file, a csv file, etc.) for each scenario. Executable generator 203 is configured to convert a description file to a test simulator compatible executable scenario. In one aspect, scenario generator 203 is used to take a scenario description file, such as, a YAML file, to run a simulation in a virtual environment and generate sensor data, such as, a video. However, any mechanisms which capture simulation specifics in a text file/database/log and uses the simulation specifics to generate simulation data can be used. Simulation data can include video data from a camera or IR camera, point cloud data from lidars, detections from radar, audio, or any other kinds of simulated sensor data. Simulation data can also include ground truth.

Test simulator 241 is configured to execute compatible execution scenarios to simulate performance of autonomous vehicle algorithm 204 in different physical environments. In one aspect, test simulator 241 is a gaming engine. The gaming engine-based simulation generates sensor data, such as video, which is passed to an autonomous vehicle algorithm 204 for processing. Alternately and/or in combination test simulator 241 can use real world sensor data to simulate performance of autonomous vehicle algorithm 204. Monitor 231 (e.g., a component of test simulator 241) is configured to monitor the outcome of executing autonomous vehicle algorithm 204 for each compatible executable scenario. Monitor 231 can output a table that includes each test case along with an indication if the test case passed or failed.

Machine learning classifier 206 is configured to classify failed simulated performances across the plurality of features. In one aspect, machine learning classifier 206 is an SVM with a linear kernel. Other machine learning classifiers, for example, linear regression, logistic regression, naïve Bayes, decision trees, etc. can be also be used. Statistics about the algorithm performance can indicate per feature how many times each feature value was associated with a failure of autonomous vehicle algorithm 204, per feature how many times a value for a non-binary feature occurred, other metrics used to understand the values of features in a simulation. Machine learning classifier 206 can also determine an importance, for example, a weight, for each feature. Per feature, the determined importance indicates the impact of the feature on the performance of autonomous vehicle algorithm 204. Machine learning classifier 206 can generate a feature importance report representing the importance of each feature.

Machine learning classifier 206 can present the higher-dimensional feature space report and the feature determined weights on dashboard 232.

Engineer 207 can view the higher dimensional-feature space report and the feature importance report on dashboard 232. Engineer 207 can enter input to modify autonomous vehicle algorithm 204 and/or can enter input to query database 201 to request additional simulated performances of autonomous vehicle algorithm 204. Requested additional performances of autonomous vehicle algorithm 204 can target features and feature values that contributed to failed performances of autonomous vehicle algorithm 204.

Figure 3:
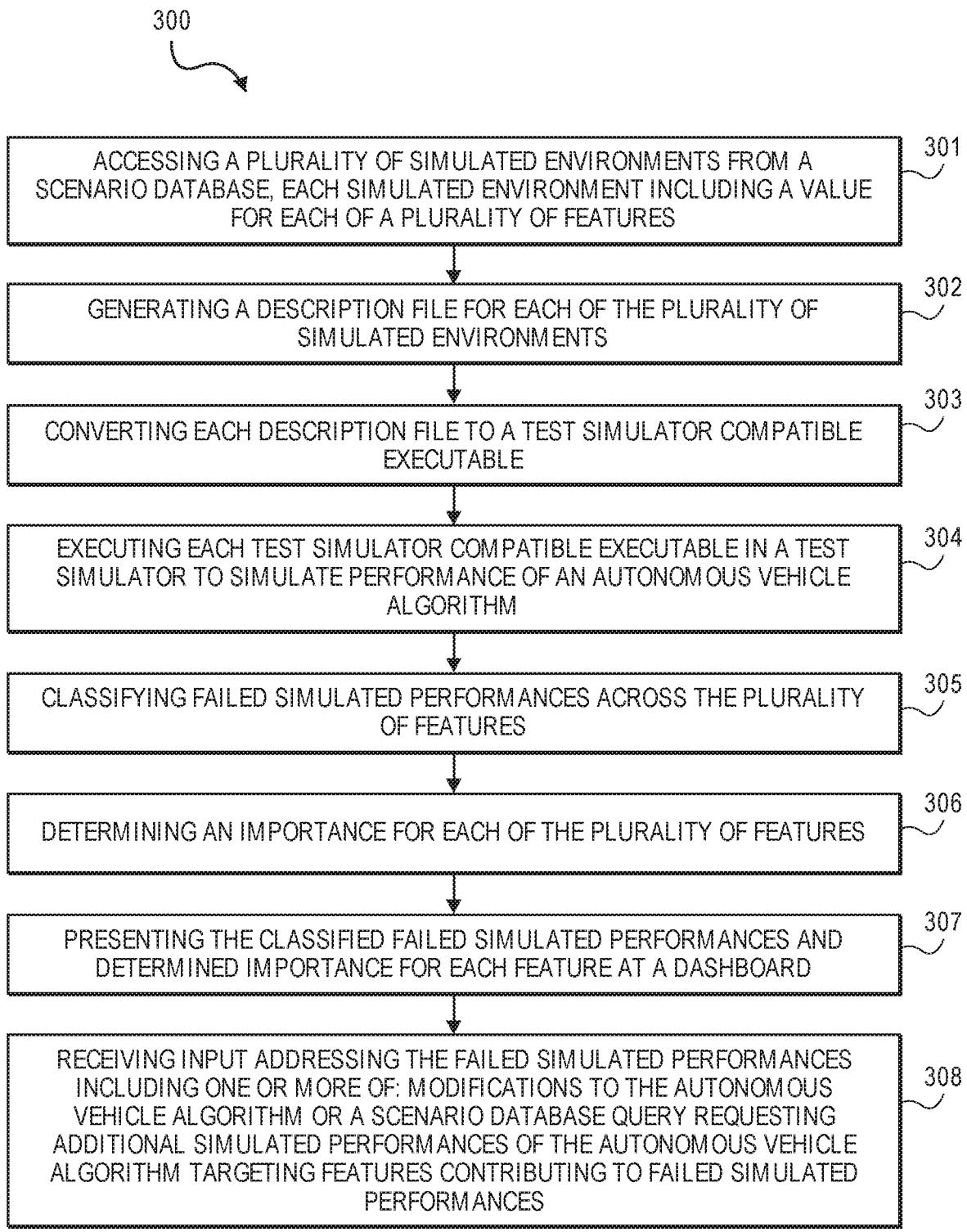
FIG. 3 illustrates a flow chart of an example method for evaluating an autonomous vehicle algorithm.

FIG. 3 illustrates a flow chart of an example method 300 for evaluating an autonomous vehicle algorithm. Method 300 will be described with respect to the components and data in computer architecture 200. In one aspect, the process of selecting subsequent queries is automated using a pre-defined metric, which identifies the feature values that most often leads to failure of an autonomous vehicle algorithm.

Method 300 includes accessing a plurality of simulated environments from a scenario database, each simulated environment including a value for each of a plurality of features (301). For example, an automated system or engineer 207 can submit random query 221 to database 201. In response to random query 221, database 201 can return settings 222. Each setting 222 includes a value for feature 212, a value for feature 213, etc. In another aspect, engineer 207 can determine what simulated environment to use for a first iteration.

Method 300 includes generating a description file for each of the plurality of simulated environments (302). For example, test case description module 202 can generate test case descriptions 223. Test case descriptions 223 can include a test case for each environment in settings 222. Test case descriptions 223 can be YAML files or formatted using some other description language.

Method 300 includes converting each description file to a test simulator compatible executable (303). For example, executable generator 203 can convert test case descriptions 223 into executables 224 compatible with test simulator 241. Executables 224 can include an executable for each test case description in test case descriptions 223. As such, each executable 224 essentially represents execution of autonomous vehicle algorithm 204 under conditions defined in a scenario from database 201 to simulate vehicle activity. Executables 224 can be used to generate sensor and logging data for performance of the autonomous vehicle algorithm. For example, logging camera data can yield video data. However, other types of sensors can also be used.

Method 300 includes executing each test simulator compatible executable in a test simulator to simulate performance of an autonomous vehicle algorithm (304). For example, test simulator 241 can execute each executable 224 to simulate autonomous vehicle algorithm 204 performing a vehicle activity. Each executable 224 represents performance of autonomous vehicle algorithm 204 in a differently defined physical environment (based on values for features 212, 213, etc.).

Monitor 231 can monitor performance of autonomous vehicle algorithm 204 during execution of each executable 224. Monitor 231 can formulate table 226 from the monitored performances. Table 226 includes each scenario (e.g., 211A, 211E, 211F, 211G) and corresponding feature values queried from database 201. For example, scenario 211A includes values 212A, 213A, etc. for features 212, 213, etc. respectively. Scenario 211E includes values 212E, 213E, etc. for features 212, 213, etc. respectively. Scenario 211F includes values 212F, 213F, etc. for features 212, 213, etc. respectively. Scenario 211G includes values 212G, 213G, etc. for features 212, 213, etc. respectively. Each scenario also includes a performance indication 214 indicating the performance of autonomous vehicle algorithm 204. Scenario performance can be defined by how the generated data meets the autonomous vehicle algorithm 204 objectives and criteria. In one example, one or more objectives and criteria are indicated as passed or failed in the physical environment simulated by the scenario.

Method 300 includes classifying failed simulated performances across the plurality of features (305). For example, machine learning classifier 206 can automatically classify failed performances (e.g., 211E, 211F, etc.). Machine learning classifier 206 can generate higher-dimensional feature space report 227. Higher-dimensional feature space report 227 can indicate per feature how often values of the feature were associated with a failed performance. For example, for feature 212, higher-dimensional feature space report 227 can indicate how often each of values 212A, 212B, 212C, 212D, etc. were associated with failed performances of autonomous vehicle algorithm 204.

Method 300 includes determining an importance of each of the plurality of features (306). For example, machine learning classifier 206 can automatically determine the importance of feature 212, the importance feature 213, etc. Per feature, machine learning classifier 206 can include a determined importance in feature importance report 228. In one aspect, machine classifier 206 computes a weight for each feature indicating the feature's importance.

Thus, machine learning classifier 206 can automatically generate reports indicating magnitude of feature values contributing to failed scenarios and indicating feature importance across failed scenarios.

Method 300 includes presenting the classified failed simulated performances and determined importance for each feature at a dashboard (307). For example, machine learning classifier 206 can present higher-dimensional report 227 and feature importance report 228 on dashboard 232. Engineer 207 can view higher-dimensional report 227 and feature importance report 228 on dashboard 232.

Method 300 includes receiving input addressing the failed simulated performances including one or more of: modifications to the autonomous vehicle algorithm or a scenario database query requesting additional simulated performances of the autonomous vehicle algorithm targeting features contributing to failed simulated performances (308). For example, engineer 207 can make decisions addressing failed simulated performances of autonomous vehicle algorithm 204 based on the content of higher-dimensional report 227 and the content of feature importance report 228. In another aspect, engineer 207 uses an automated process to address failed simulated performances, such as, for example, to select of subsequent test cases. In a further aspect, subsequent test cases are selected using a metric where the selector identifies the feature value which most often leads to failure of the algorithm.

In one aspect, engineer 207 enters algorithm update 229 to modify autonomous vehicle algorithm 204. Test simulator 241 can receive algorithm update 229 and apply algorithm update 229 to autonomous vehicle algorithm 204. In another aspect, engineer 207 enters query 233 to database 201. Database 201 can receive query 233 and identify additional environments responsive to query 233. As such, engineer 207 can refine scenarios to obtain additional information on feature value combinations contributing to failed scenarios.

Figure 4A:
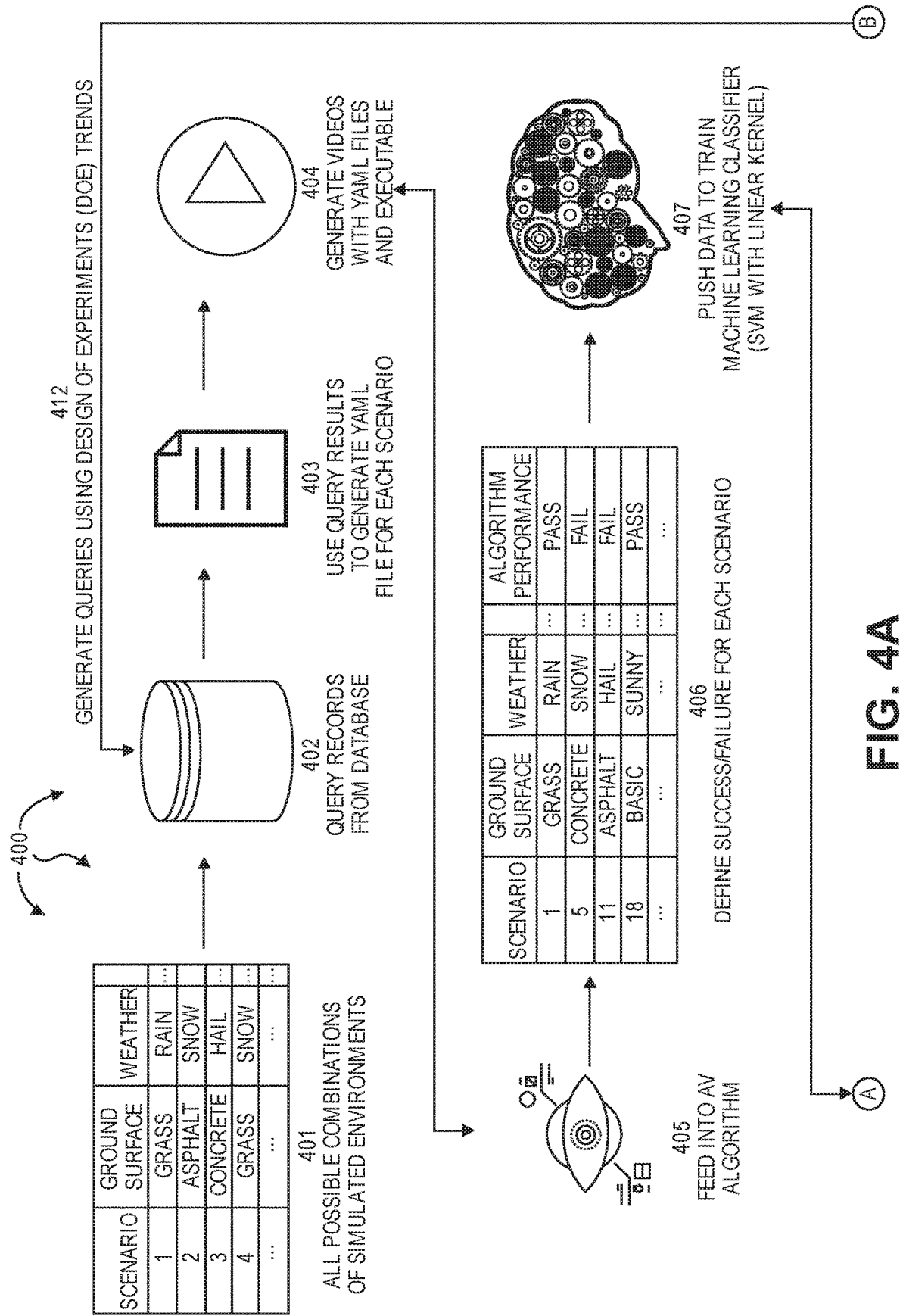
FIGS. 4A and 4B illustrate an example data flow for evaluating an autonomous vehicle algorithm.
Figure 4B:
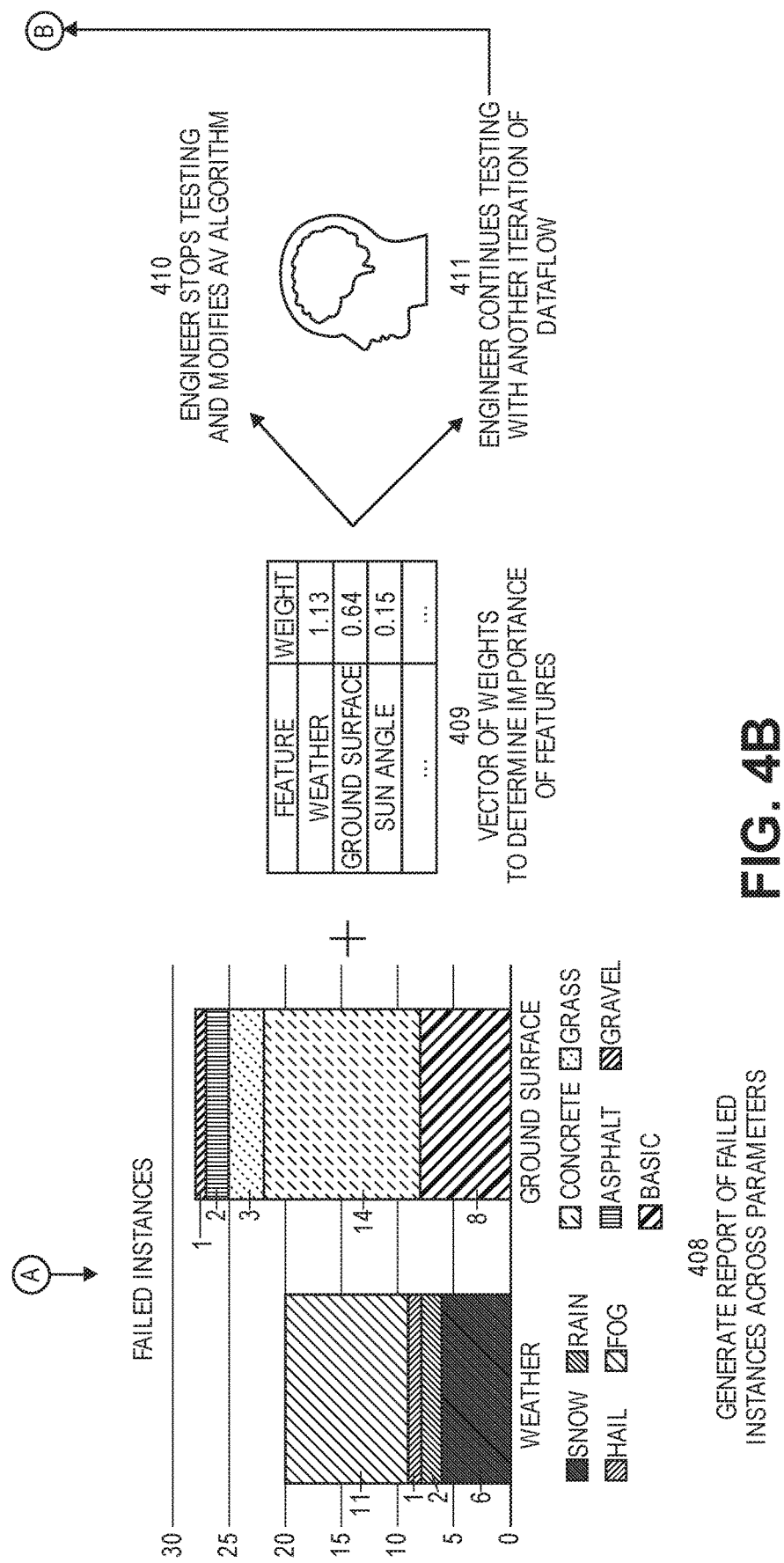

FIGS. 4A and 4B illustrate an example data flow 400 for evaluating an autonomous vehicle algorithm. All possible combinations of simulated environments are entered into a database (401). Records are queried from the database (402). Query results are used to generate a YAML file for each scenario (403). YAML files are input to the executable which generates sensor data (e.g., a video) (404).

The videos with YAML files and executables are fed into an autonomous vehicle algorithm (405). Success/failure is defined for each scenario (406). A set of features along with success/failure of the algorithm are pushed to train a machine learning classifier, such as, an SVM with a linear kernel (407). A report of failed instances across all features by feature value is generated (408). The numbers in 408 indicate how many times a feature value was associated with an autonomous vehicle algorithm failure. A vector of weights is used to determine the importance of features (409).

An engineer can stop testing and modify the autonomous vehicle algorithm (410) or can continue testing with another iteration of the dataflow (411). The engineer can generate queries using Design of Experiment (DOE) trends (412).

Accordingly, aspects of the invention include testing autonomous algorithms on simulated data. Testing can utilize supervised machine learning techniques, such as, Support Vector Machines (SVMs), to identify scenario features most likely to influence algorithm performance. Insights can be consolidated and generation of relevant test cases automated over multiple iterations to highlight error-prone scenarios.

The initial scenarios and success/failure labels are concatenated to form a new dataset. The new database is used to train a supervised machine learning classifier, such as, an SVM. A linear kernel can be used to obtain a vector of weights, where each weight is associated with a specific feature. The magnitude of these weights identifies the importance of different features. A report is generated based on the initial query scenario that summarizes the patterns and trends for different features and their values in the simulation results. Based on the report, the autonomous algorithm is modified for better performance or queries for the next iteration of testing designed which focuses on error-prone scenarios.

In one aspect, one or more processors are configured to execute instructions (e.g., computer-readable instructions, computer-executable instructions, etc.) to perform any of a plurality of described operations. The one or more processors can access information from system memory and/or store information in system memory. The one or more processors can transform information between different formats, such as, for example, features, values, scenarios, environments, test case descriptions, executables, tables, higher-dimensional feature space reports, feature importance reports, algorithm updates, queries, etc.

System memory can be coupled to the one or more processors and can store instructions (e.g., computer-readable instructions, computer-executable instructions, etc.) executed by the one or more processors. The system memory can also be configured to store any of a plurality of other types of data generated by the described components, for example, features, values, scenarios, environments, test case descriptions, executables, tables, higher-dimensional feature space reports, feature importance reports, algorithm updates, queries, etc.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash or other vehicle computer, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications, variations, and combinations are possible in light of the above teaching. Further, it should be noted that any or all of the aforementioned alternate implementations may be used in any combination desired to form additional hybrid implementations of the disclosure.

What is claimed:

1. A vehicle simulation method comprising:
for each of a plurality of scenarios defining environmental conditions and ground surface conditions through feature/value pairs in a database, executing an autonomous vehicle algorithm simulating vehicle activity under environmental conditions and ground surface conditions defined in the scenario;
identifying one or more autonomous vehicle algorithm performance failures from among the plurality of scenarios;
automatically classifying the one or more autonomous vehicle algorithm performance failures per feature and per feature value;
automatically generating reports based at least in part on classification of the algorithm performance failures and indicating: (1) feature value magnitudes contributing to autonomous vehicle algorithm performance failures and (2) feature importance across autonomous vehicle algorithm performance failures; and
refining the plurality of scenarios to obtain additional information on feature value combinations contributing to autonomous vehicle algorithm performance failures in view of at least one of: the feature value magnitudes or the feature importance.

2. The method of claim 1, further comprising formulating the plurality of scenarios, each scenario including a different combination of values for a plurality of features.

3. The method of claim 2, wherein formulating the plurality of scenarios comprises:
accessing a selection of scenario descriptions from a scenario database; and
converting each scenario description to a corresponding scenario.

4. The method of claim 3, wherein converting each scenario description to a corresponding scenario comprises a simulator generating a video using a YAML file; and
wherein the autonomous vehicle algorithm is executed on the video according to the environmental conditions and ground surface conditions defined in the scenario.

5. The method of claim 1, further comprising monitoring executing of the autonomous vehicle algorithm with simulated sensors in a testing simulator; and
wherein automatically classifying autonomous vehicle algorithm performance failures comprises classifying autonomous vehicle algorithm performance failures from the monitored execution.

6. The method of claim 1, further comprising modifying the autonomous vehicle algorithm to address feature value magnitudes contributing to failed autonomous vehicle algorithm performance failures.

7. The method of claim 1, wherein executing an autonomous vehicle algorithm comprises executing the autonomous vehicle algorithm in one of a: virtual environment or a physical environment; and
further comprising presenting the generated reports on a dashboard.

8. The method of claim 1, wherein automatically generating reports comprises a support vector machine (SVM) with a linear kernel automatically generating the reports.

9. The method of claim 1, wherein automatically generating reports comprises generating a report that maps each feature to a weight.

10. The method of claim 1, wherein refining the plurality of scenarios comprises:
formulating a query from from features and feature values having increased contribution to autonomous vehicle algorithm performance failures;
submitting the query to the database; and
receiving a description file describing a plurality of additional scenarios.

11. A method comprising:
accessing a plurality of defined simulated environments from a database, each defined simulated environment defining at least weather conditions and a ground surface type through feature/value pairs stored in the database including a value for each of a plurality of features;
deriving a corresponding plurality of simulator compatible executables from the plurality of defined simulated environments;
for each simulator compatible executable included in the plurality of simulator compatible executables, simulating performance of an autonomous vehicle algorithm using the simulator compatible executable in a simulator;
identifying one or more simulation performance failures from among the plurality of simulator compatible executables;
classifying the one or more simulation performance failures across the plurality of features;
determining an importance for each feature, included in the plurality of features, to the one or more simulation performance failures;
presenting the classified one or more simulation performance failures and the determined importance for each feature on a dashboard; and
receiving input addressing the one or more simulation performance failures including at least one of: (1) modifying the autonomous vehicle algorithm or (2) modifying a database query requesting additional simulated performances of the autonomous vehicle algorithm targeting features having specified importance to the one or more simulation performance failures.

12. The method of claim 11, wherein simulating performance of an autonomous vehicle algorithm comprises executing the simulator compatible executable in a gaming engine generating a virtual environment.

13. The method of claim 11, wherein deriving a corresponding plurality of simulator compatible executables from the plurality of defined simulated environments comprises:
generating a corresponding plurality of YAML description files from the plurality of simulated environments; and
converting the plurality of YAML description files into the corresponding plurality of simulator compatible executables.

14. The method of claim 13, wherein converting the plurality of YAML description files comprises generating a corresponding plurality of videos using the plurality of YAML description files.

15. The method of claim 11, wherein classifying the one or more simulation performance failures comprises a support vector machine (SVM) computing, per feature, the number instances of each feature value across the one or more simulation performance failures.

16. The method of claim 15, wherein determining an importance for each comprises the support vector machine (SVM) computing a vector of feature weights.

17. A computer system comprising:
a processor;
system memory coupled to the processor and storing instructions configured to:
access a random plurality of simulated environments from a larger plurality of simulated environments stored in a database, each simulated environment including feature/value pairs, including a value for each of a plurality of features, defining at least weather conditions and a ground surface type;
derive a corresponding plurality of simulator compatible executables from the random plurality of simulated environments;
for each simulator compatible executable included in the random plurality of simulator compatible executables, simulate performance of an autonomous vehicle algorithm using the simulator compatible executable in a simulator;
identify one or more simulation performance failures from among the plurality of simulator compatible executables;
classify the one or more simulation performance failures across the plurality of features;
determine a weight for each of the plurality of features, the weight indicating the contribution of the feature to the one or more simulation performance failures;

present the one or more simulation performance failures and determined weights on a dashboard;

access an additional plurality of simulated environments, from the larger plurality of simulated environments stored in the database, targeting features having at least a specified contribution to the one or more simulation performance failures based on determined weight;

derive a corresponding additional plurality of simulator compatible executables from the additional plurality of simulated environments; and for each simulator compatible executable included in the additional plurality of simulator compatible executables, simulate performance of the autonomous vehicle algorithm using the simulator compatible executable in the simulator.

18. The computer system of claim 17, wherein the instructions configured to derive a corresponding plurality of simulator compatible executables from the random plurality of simulated environments comprise instructions configured to:

generate a corresponding plurality of YAML description files from the random plurality of simulated environments; and convert the corresponding plurality of YAML files into a plurality of videos.

19. The computer system of claim 17, wherein the instructions configured to classify the one or more simulation performance failures across the plurality of features comprise a support vector machine (SVM) configured to compute, per feature, the number instances of each value across the one or more simulation performance failures.

20. The computer system of claim 19, wherein the instructions configured to determine a weight for each of the plurality of features comprises the support vector machine (SVM) configured to compute a vector of feature weights.

* * * * *